United States Patent [19]

Caruso et al.

[11] 4,132,570
[45] Jan. 2, 1979

[54] STRUCTURAL SUPPORT FOR SOLAR CELL ARRAY

[75] Inventors: Paul J. Caruso, Bedford; William T. Kurth, Beverly, both of Mass.

[73] Assignee: Exxon Research & Engineering Co., Florham Park, N.J.

[21] Appl. No.: 888,923

[22] Filed: Mar. 22, 1978

Related U.S. Application Data

[63] Continuation of Ser. No. 827,146, Aug. 24, 1977, abandoned.

[51] Int. Cl.² .............................................. H01L 31/04
[52] U.S. Cl. .................................................... 136/89 P
[58] Field of Search ...................................... 136/89 P

[56] References Cited

U.S. PATENT DOCUMENTS

| | | | |
|---|---|---|---|
| 3,268,366 | 8/1966 | Guyot | 136/89 |
| 3,457,427 | 7/1969 | Tarneja et al. | 250/239 |
| 3,562,020 | 2/1971 | Blevins | 136/89 |
| 3,565,719 | 2/1971 | Webb | 156/212 |
| 3,833,426 | 9/1974 | Nesch | 136/89 |
| 3,874,931 | 4/1975 | Haynos | 136/89 |
| 3,982,963 | 9/1976 | Mahoney et al. | 136/89 |
| 4,015,653 | 4/1977 | Slysh | 160/213 |
| 4,045,245 | 8/1977 | Coleman et al. | 136/89 |

*Primary Examiner*—John H. Mack
*Assistant Examiner*—Aaron Weisstuch
*Attorney, Agent, or Firm*—Joseph J. Dvorak

[57] ABSTRACT

A support for a solar cell array includes means for positioning the solar cells and limiting the relative movement of the cells. Integral rib stiffeners are provided as well as at least one integral junction box. The support further includes a perimeter skirt which may be used for connecting modules having the support to each other or to a mounting standard.

18 Claims, 7 Drawing Figures

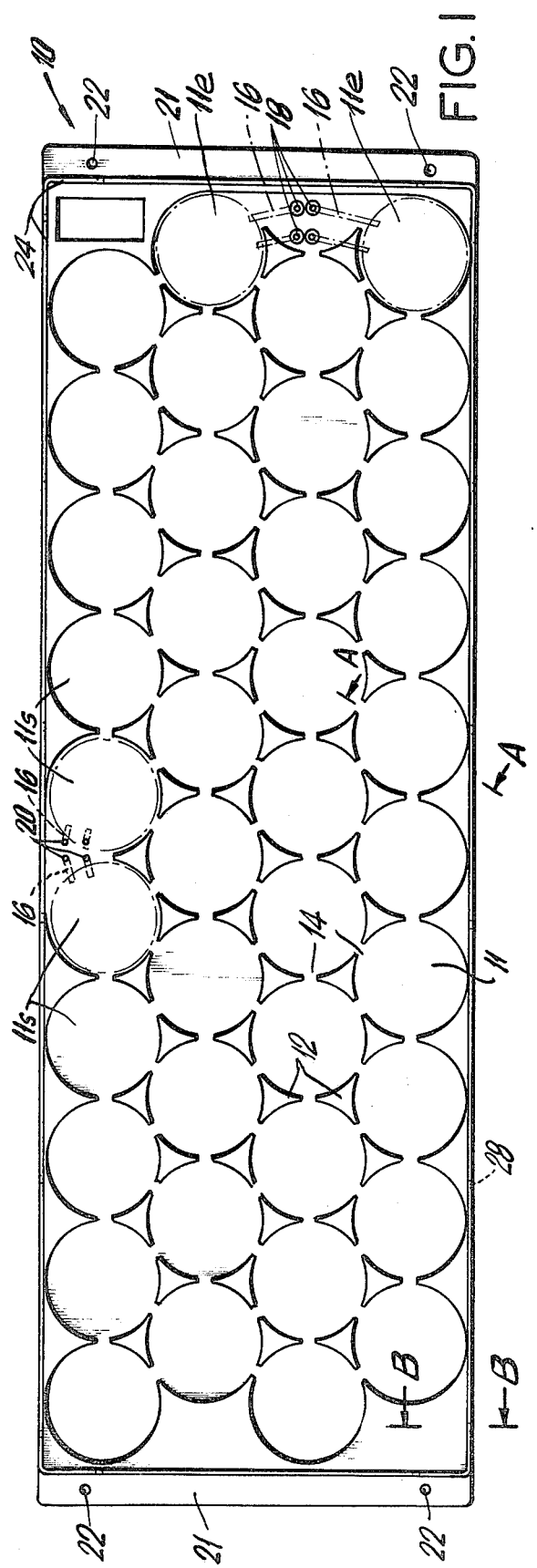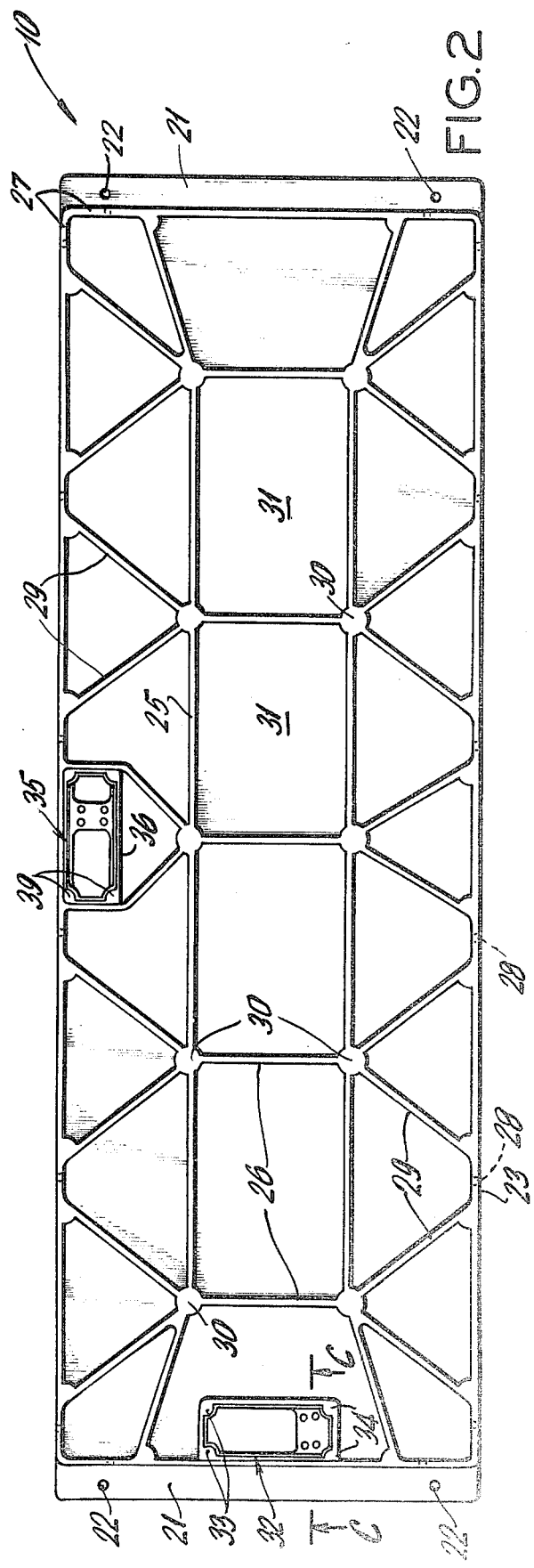

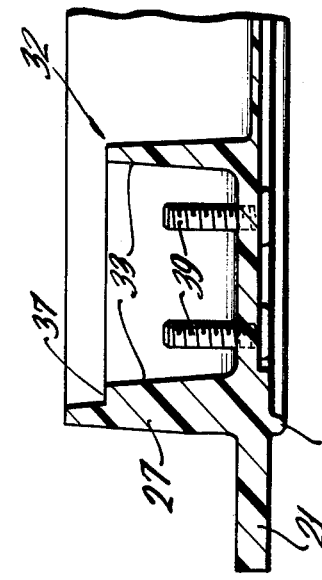
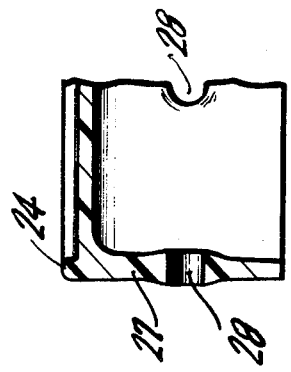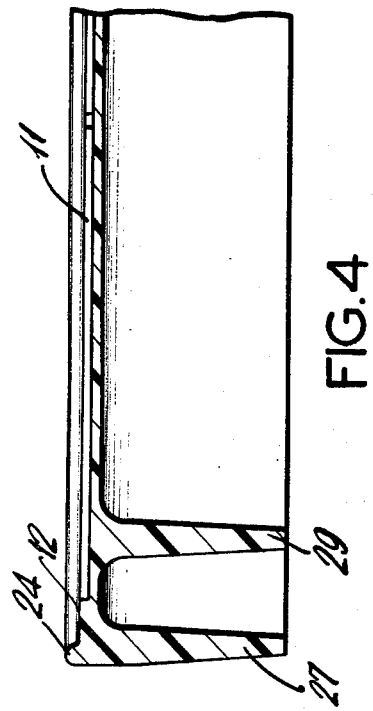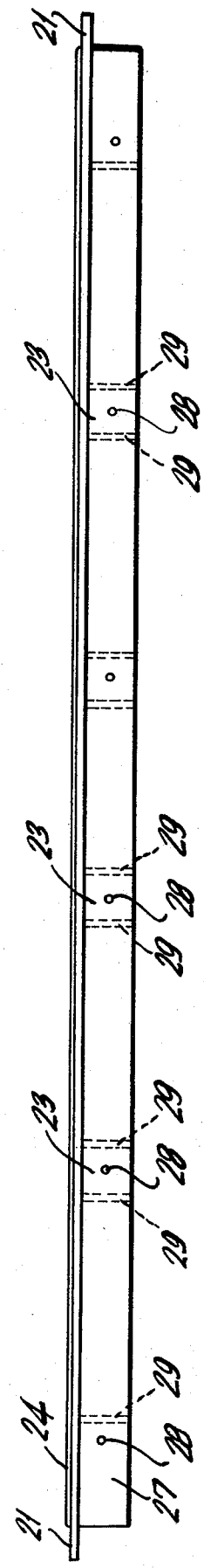

STRUCTURAL SUPPORT FOR SOLAR CELL ARRAY

This is a continuation of application Ser. No. 827,146, filed Aug. 24, 1977 now abandoned.

BACKGROUND OF THE INVENTION

The present invention relates to a solar cell module. More particularly, the present invention relates to a support for an array of photoelectric solar cells which simplifies the method of assembling solar cell arrays into a module and permits the mechanical connection of modules to each other and for mounting on supporting standards at the proper angle of inclination for interception of solar radiation.

A solar cell array comprises a plurality of individual cells and interconnector means for electrically connecting adjacent cells in a matrix. Typically, the individual solar cells are arranged in columns and rows and the interconnector means are positioned so as to connect the cells in the requisite series and/or parallel circuit arrangement. The circuit arrangement, of course, depends upon the desired voltage and short circuit current.

Generally, for terrestrial applications, a solar cell array is fabricated and sold as a module comprising the solar cell array mounted on an electrically nonconductive support member having terminals provided therein. The module also has a top cover over the solar cell array. This cover is a transparent protective coating which protects the solar cells against environmental hazards and also serves to maintain the cells in proper position. The module typically is fitted into a metal frame which provides the mechanical strength for the array and the module to protect them against damage due to environmental loadings, such as from wind, snow, ice, rain, etc. The metal frame also serves as a means for mounting the module at the proper angle to receive insolation.

The standard method of forming the cells into an array of the type described begins with the step of aligning the cells in rows and columns. This is done on an alignment or spacing jig. Relatively flexible metallic interconnectors are attached to the cell electrodes by soldering or welding. Each interconnector extends from the top electrode of one cell to the bottom electrode of the next adjacent cell, and rows of cells are similarly connected. Consequently, there is a lot of handling and movement of individual cells in order to properly index or position the cells and complete the soldering and welding. After the electrical series and/or parallel cell matrix has been formed, it is necessary to mount the cell matrix on a rigid support. Thus, the cell matrix is lifted from the jig and placed on the substrate for support. Typically the matrix is then soldered via metallic interconnectors to terminal posts provided on the support.

Finally, a protective cover is placed over the cells. This must be done while taking particular care to keep the cells from touching each other; otherwise cells touching will result in short circuiting the system.

As will be appreciated, in its normal operational environment, a solar cell module is generally exposed to extreme temperature changes or thermal cycling. This thermal cycling causes thermal expansion and contraction of the cells, the supporting substrate and the cover material. Since all these materials have vastly different thermal coefficients of expansion, there is a relative movement of the cells toward and away from one another. Existing solar cell modules employ flexible electrical interconnectors to accommodate this relative movement; however, extreme care must be taken in mounting the solar cell array between its substrate and cover so that relative movement of the cells does not cause adjacent cells to contact each other and short circuit.

As indicated hereinabove, in the past these solar cell modules have been further supported in a metal frame so as to provide the high mechanical strength required for mounting the modules in the field for actual use where they are subjected to the environmental loadings such as wind, snow, ice or rain, etc.

Although various types of supports have been proposed on which to mount solar cell arrays, the supports suggested in the past do not simultaneously possess the important qualities of rigidity and light weight; nor do they provide a simple means for positioning and maintaining solar cell arrays in the desired location. Other deficiencies, too, are known.

SUMMARY OF THE INVENTION

The present invention contemplates an improved support for a solar cell array. The support includes means for positioning the solar cells and thereafter limiting the relative movement of the individual cells, particularly when a completed module, including the support, array and cover, is subjected to environmental loadings. The support structure is formed of a light weight high strength plastic material having integral rib stiffeners to provide longitudinal and lateral stiffness but allow for torsional flexibility to take support warpage. The support is also provided with a perimeter skirt for mounting supports and especially completed modules to each other or to an appropriate standard. Optionally and preferably flanges are also provided in the support structure for versatility in the ways in which a module having such a support may be mounted for receiving insolation. At least one junction box, and preferably two junction boxes, are provided on the support structure to allow terminations to be encapsulated or otherwise protected from harm by the environment and/or animals. Posts also are provided at the intersection of the integral rib stiffeners to allow installation of a cover for electronic packages mounted in the cavities formed by the rib stiffeners. The support structure has a perimeter dike on the top surface of the structure which serves to contain encapsulating material in the top surface when an encapsulating material is employed. The perimeter dike also protects the edges of a cover sheet of rigid transparent material, when such material is used in forming the module.

The advantages and other features of the invention will be apparent from the specification which follows and from the drawings wherein like numerals are used throughout to identify like parts.

BRIEF DESCRIPTION OF THE DRAWINGS

FIG. 1 is a top plan view of the preferred support structure of the present invention.

FIG. 2 is a bottom plan view of the preferred support structure of the present invention.

FIG. 4 is a side elevation taken along lines A—A of FIG. 1.

FIG. 5 is a side elevation section taken along lines B—B of FIG. 1.

FIG. 6 is a side elevation of FIG. 1 with dotted lines showing the relative positions of the rib stiffeners.

FIG. 7 is a side elevation taken along lines C—C of FIG. 2 with end terminal posts drawn in.

DETAILED DESCRIPTION OF THE DRAWINGS

Figure 3:
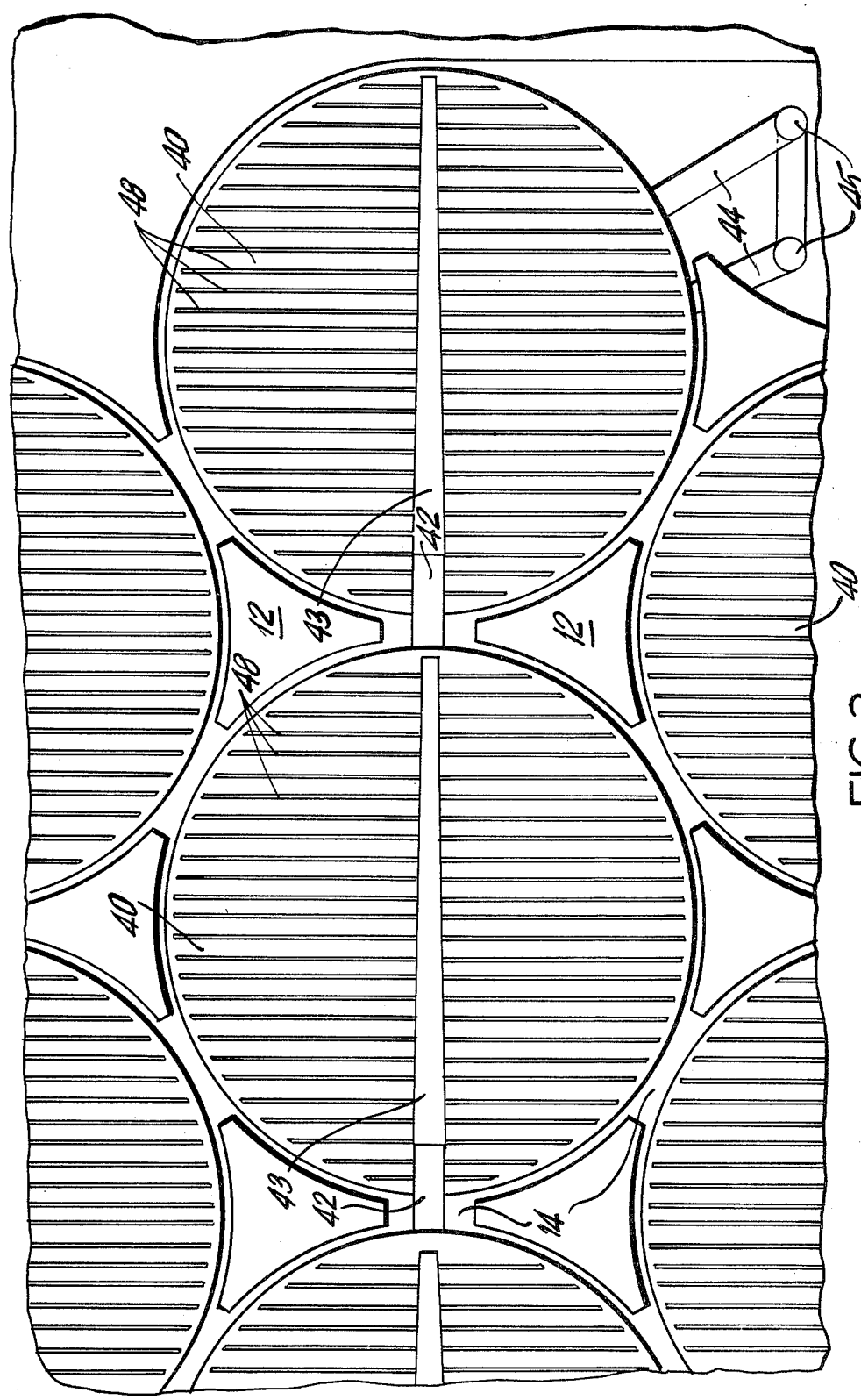
FIG. 3 is a fragmentary top plan view showing solar cells located on the support structure and interconnected in series.

Referring in general to FIGS. 1 to 7 and in particular to FIG. 1, there is shown a support structure 10 which is formed from an electrically nonconductive material such as high density high strength plastics. Preferably, support structure 10 is molded from a fiber-reinforced plastic such as a polyester or polyepoxide resin. The reinforcing fibers may be glass, carbon, boron and the like. Preferably commercially available polyester resin containing 70 wt. % resin and 30 wt. % staple length glass fibers are employed in molding the support structure 10. The polyester material is preferred because of its high strength, its stability when exposed for long periods of time to ultraviolet radiation and because of its other environmental characteristics.

As is shown in FIG. 1, support structure 10 is generally and preferably rectangular in shape. Typical dimensions for the support are 46 inches long by 15 inches wide by 2 inches deep.

Located on the top surface of structure 10 are a plurality of wells 11. Each well 11 is designed to accommodate a photovoltaic cell. As is shown in FIG. 1, wells 11 are generally circular, thereby accommodating circular solar cells. The diameter of the well is slightly larger than the diameter of the silicon solar cell and the depth of the well is about 0.1 inches deep up to a depth equal to the thickness of the solar cell for which it is designed to accommodate. Using the typical dimensions given above, forty wells 11 can be provided in the top surface of support structure 10 to accommodate that number of 100 mm diameter solar cells. Obviously support structure 10 having wells with diameters suitable to accommodate 100 mm diameter solar cells will also be suitable to accommodate solar cells having smaller diameters, for example solar cells having 90 mm diameters.

Wells 11 are separated one from the other by a plurality of land areas 12 through which openings or gates 14 are provided. Gates 14 provide access not only to succeeding wells 11 in the same row, but also to wells 11 in adjacent rows, thereby permitting series and/or parallel connections between solar cells placed in the wells 11. Terminal gates 16 are also provided to accommodate interconnections between solar cells placed in end wells designated 11e and side wells designated 11s so as to accommodate interconnections between such solar cells and output terminals. Terminal post holes 18 are provided through which terminal posts such as post 39 shown in FIG. 7 can be inserted for electrical connection to a load.

In the embodiment shown in FIG. 1, depressions 20 are provided on the surface of structure 10 through which holes may be drilled to accommodate terminal posts if desired as will be explained hereinafter in greater detail. These depressions are optional but preferable as locators for optional terminations.

Structure 10 is provided with flanges 21 having bolt holes 22 therein for mounting the support and especially a solar cell module containing the support on an appropriate stand.

Around the perimeter of the top surfaces of structure 10 is a perimeter dike 24. Dike 24 serves to contain any encapsulating material that may be used to protect the solar cells and hold them in place on the structure 10. In the event that a rigid transparent material is employed to cover the solar cells as well, the dike also serves to position the rigid transparent cover sheet material and to protect its edges from chipping or otherwise cracking.

As can be seen in FIG. 2, extending downwardly from the bottom surface of support structure 10 are integral longitudinal rib stiffeners 25 which are spaced apart in parallel relationship. These rib stiffeners are connected to each other by lateral rib stiffeners 26. Around the perimeter of the bottom surface of support structure 10 is a downwardly descending perimeter skirt 27. Skirt 27 may be provided with a plurality of holes 28 at predetermined intervals such as those designated at 23 for bolting a number of modules to each other or for bolting a module to a standard. Connecting the skirt 27 and the longitudinal rib stiffeners 25 are a plurality of angular rib stiffeners 29. At least one rib stiffener 29 extends from skirt 27 at a point adjacent bolt hole 28, if so provided. Also, optionally and preferably the areas at which stiffeners 25, 26 and 29 join with each other and where stiffener 29 joins with perimeter skirt 27 are integral thickened portions or posts 30. The stiffeners 25, 26 and 29, posts 30 and perimeter skirt 27 typically extend downwardly the same distance and provide the major portion of the approximate 2 inch depth for the typical support structure 10. Also, stiffeners 25 and 26, for example, define a plurality of cavities 31 in which different electronic packages may be mounted as desired. Posts 30 may be used for fastening a cover (not shown) over such electronic packages (not shown).

At least one junction box is molded on the bottom of structure 10. Thus, junction box 32 is provided along one lateral end of structure 10. The junction box is formed by a plurality of downwardly extending walls 33. As can be seen in FIG. 7, one side of the junction box 32 is formed in perimeter skirt 27 by providing a shoulder 37 of equal height to side walls 33. Optionally a separate side wall can be provided. Posts 34 are provided at the corners of the junction box 32 to which a cover, if desired, can be mounted. Very simply, holes can be drilled into posts 34 to which a cover can then be screwed.

Optionally and preferably a second junction box 35 is shown in FIG. 2 along one longitudinal side wall. This junction box 35 is formed by the portion of perimeter skirt 27 and walls 36, similar to junction box 32.

As shown in FIG. 7, terminal end posts 39 are bolted through support structure 10 providing a means of connecting the solar cells on the surface of structure 10 to a load such as a battery (not shown).

Referring now to FIG. 3, a plurality of solar cells 40 are shown connected, in this instance, in series by means of flexible interconnectors 42. Thus, the electrode on the bottom of one solar cell 40 is connected via a flexible interconnector 42 to the top bus bar 43 of the next succeeding solar cell 40. The bus bars 43 connect the electrically conductive fingers on the surface of the cell. Also, as can be seen, the interconnector 42 extends through the gate 14 in the top surface of support structure 10; and, land area 12, surrounding the solar cells 40, prevents the cells 40 from coming into contact with each other during thermal cycling of the completed module and also during construction of the module. A flexible termination interconnector 44 is shown passing through gate 16 from the bottom of the last solar cell 40 in the series of solar cells and is soldered to termination post 45 which extends through the panel.

As mentioned in connection particularly with reference to FIG. 1, in a typical support structure 10 provision is made to accommodate forty solar cells having diameters of about 100 mm. These solar cells may be linked in series and connected to the termination posts provided at junction box 32; however, provision for a second junction box 35, as shown for example in FIG. 2, permits other arrangements of the solar cells using the same support structure. For example, the cells can be arrayed into two groups of 20 cells each, connected for example in series, with one group of 20 cells being connected to termination posts in junction box 32 and the second group being connected to termination posts provided in junction box 35. Provision of the optional second junction box 35 also permits use of the support structure 10 for an array of three groups of solar cells in parallel arrangement, for example with each group containing 12 cells connected in series. It will be appreciated that the precise arrangement or arraying of the solar cells depends upon the desired short circuit current voltage and that the provision of two junction boxes gives greater flexibility to the number of different arrangements of cells that can be used with a given support structure. Thus, in the event a circuit arrangement is desired which would for convenience in manufacture require termination at a point along a longitudinal side rather than at the lateral side, depressions 20 in the surface of support structure 10 serve as markers for locating access to junction box 35 on the other side. Holes can then be very conveniently drilled through the structure at depressions 20 for installing termination posts.

Referring now especially to FIG. 6, perimeter skirt 27 is connected to integral rib stiffeners 25 via angular rib stiffeners 29 at a plurality of predetermined locations. Optionally and preferably the wall thickness of perimeter skirt 27 adjacent the rib stiffeners 29, for example at 23, is slightly thickened for added strength particularly when bolt holes 28 are provided for bolting a number of modules having the support 10 of this invention. Thus, rib stiffeners 29 provide a load path for any bolts or fasteners used in connecting modules to each other or when mounting the module to a standard.

In forming a module a plurality of solar cells are interconnected to each other in the desired series and/or parallel arrangement and to termination poles on a jig. Encapsulating material well known to the electronics and solar cell industry, such as a silicone rubber, is placed on the top surface of support structure 10 within the dike 24. The solar cell array is then placed on support structure 10 with wells 11 serving as locators for each of the cells in the array. The array sinks into the encapsulant and becomes covered by it. Land areas 12 keep the cells from moving into contact with each other as the array is positioned and as the terminal poles are inserted through holes 18, for example. For added protection, particularly where animals are likely to have access to the module a thin cover glass sheet is placed over the area. The land areas 12 again serve in maintaining the relative positions of the cells while the glass is put in place. Thereafter, the encapsulant is allowed to cure at room temperature.

As indicated herein, modules may be connected to each other by means of fasteners inserted through bolt holes provided in skirt 27. A module or modules also can be mounted at the proper tilt via skirt 27 or via flanges 21.

As should be appreciated, numerous and varied other arrangements can be readily devised by those skilled in the art in accordance with the principles set forth herein without departing from the spirit and scope of the invention.

What is claimed is:

1. A support structure for a solar cell array comprising:
    an electrically nonconductive material having a top surface and a bottom surface, said top surface having a plurality of wells for receiving an individual solar cell in each well;
    gates providing access to succeeding and adjacent wells whereby solar cells in an array supported by said structure can be electrically connected to each other;
    gates providing access to terminal posts whereby a solar cell array supported by said structure can be connected to an external load;
    a dike around the perimeter of said top surface for containing encapsulant on the surface of said support; and
    said bottom surface having a plurality of longitudinally arranged rib stiffeners integral with said support structure and a plurality of laterally arranged rib stiffeners integral with said support structure, said rib stiffeners extending downwardly from said bottom surface of said support;
    an integral skirt extending downwardly from said bottom surface around the perimeter of said support structure;
    a plurality of angularly arranged rib stiffeners integral with said support structure connecting said perimeter skirt with said longitudinal support stiffeners; and,
    downwardly extending walls defining a junction box for electrical connectors.

2. The device of claim 1 wherein said electrically nonconductive material is a fiber reinforced plastic resin.

3. The support of claim 1 wherein the perimeter skirt has at predetermined space intervals a thickened wall portion.

4. The support of claim 3 wherein said thickened wall portion is adjacent an angular rib stiffener connecting said skirt and said longitudinal rib stiffeners.

5. The device of claim 4 wherein bolt holes are provided in the thickened wall portion of the skirt adjacent said angular rib stiffener.

6. The device of claim 3 wherein said integral stiffeners meet at a point defining a post.

7. The support of claim 6 including flanges extending outwardly from the top of said support whereby said support can be mounted via said flanges and fasteners to external mounting standards.

8. The support of claim 6 including bolt holes in said skirt at predetermined intervals and adjacent said angularly arranged rib stiffeners whereby said support structure can be mounted to another support and to an external standard by fastening means.

9. The device of claim 1 wherein a flange is provided for mounting said support to a standard.

10. The device of claim 6 wherein said flange is coextensive with the top surface of said support structure and extends outwardly at the lateral ends thereof.

11. The device of claim 1 including a second junction box integral with the bottom surface of said support structure.

12. The device of claim 11 wherein said first junction box is at one end adjacent said skirt and said second junction box is at one side adjacent said skirt.

13. A support structure for an array of solar cells comprising:
   An electrically nonconductive body having a top surface and a bottom surface, said top surface having a plurality of wells for receiving solar cells therein, said wells being separated by a land area thereby preventing said cells from touching each other when positioned on said support;
   said top surface having a dike around the perimeter thereof for receiving light transparent covering material therein;
   flange means coextensive with said top surface for connecting said support to standards;
   gates on said top surface providing electrical access between adjacent and serially located wells whereby said solar cells may be arrayed in parallel and series arrangement;
   gates in said surface providing electrical access from said wells to electrical terminals for connection to an electrical load;
   extending downwardly from said bottom surface of said support and integral therewith, a plurality of longitudinally arranged rib stiffeners;
   extending downwardly from said bottom surface of said support and integral therewith a plurality of laterally arranged rib stiffeners connecting and integral with said longitudinal rib stiffeners;
   extending downwardly along the perimeter of said bottom surface and integral therewith a perimeter skirt;
   a plurality of angularly arranged rib stiffeners extending downwardly from the bottom of said support structure integral with said perimeter skirt and said longitudinal rib stiffeners;
   a junction box at one end of said support structure and integral therewith formed by downwardly extending side walls; and
   a molded junction box at one side of said support structure and integral therewith formed by downwardly extending side walls.

14. In a solar cell module having a plurality of solar cells arrayed on a support structure and having a transparent covering material over said solar cell array, the improvement comprising:
   an electrically non-conductive rigid support structure having a top surface and a bottom surface;
   a plurality of wells located in said top surface for receiving each of said solar cells in said solar cell array;
   gates between said wells thereby permitting electrical connection between the solar cells in the solar cell array;
   land areas separating said wells whereby said wells serve to position said solar cells on the surface of said support and said land areas serve to prevent said solar cells from touching each other and thereby short circuiting said array;
   integral with said support structure and extending downwardly from said bottom surface are at least two longitudinally arranged rib stiffeners, said longitudinally arranged rib stiffeners being parallel with each other;
   integral with said support structure and extending downwardly from the bottom surface thereof are laterally arranged rib stiffeners interconnecting said longitudinally arranged rib stiffeners;
   integral with said bottom surface and extending downwardly therefrom around the perimeter is a skirt;
   integral with said support structure and extending downwardly therefrom is a plurality of angularly arranged rib stiffeners connecting said skirt to said longitudinal rib stiffeners;
   integral with said support structure and extending downwardly from said bottom surface are three walls defining together with a portion of said skirt a junction box; and,
   terminal means extending from said top surface to said junction box whereby said solar cell array on said surface can be electrically connected to a load.

15. The improvement of claim 14 including three additional downwardly extending integral walls defining with a portion of said skirt a second junction box.

16. The improvement of claim 15 including a thickened portion at the junction of said longitudinal, lateral and angular rib stiffeners and at the junction of said angular rib stiffeners and said skirt, said thickened portion defining posts to which covers can be fastened.

17. The improvement of claim 15 wherein said support structure is formed from a plastic resin selected from the group consisting of polyester and polyepoxide resins and wherein said resin is reinforced with fibers selected from the group consisting of glass, boron and carbon.

18. The improvement of claim 17 wherein the resin is a polyester and the fiber is glass.

* * * * *